(12) United States Patent
Kim et al.

(10) Patent No.: US 10,770,416 B2
(45) Date of Patent: Sep. 8, 2020

(54) SEMICONDUCTOR PACKAGE

(71) Applicant: SAMSUNG ELECTRONICS CO., LTD., Suwon-si (KR)

(72) Inventors: Byung Ho Kim, Suwon-si (KR); Jae Hoon Choi, Suwon-si (KR); Joo Young Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/282,980

(22) Filed: Feb. 22, 2019

(65) Prior Publication Data
US 2020/0075517 A1 Mar. 5, 2020

(30) Foreign Application Priority Data
Aug. 30, 2018 (KR) .................... 10-2018-0102886

(51) Int. Cl.
*H01L 23/00* (2006.01)
(52) U.S. Cl.
CPC .............. *H01L 24/02* (2013.01); *H01L 24/13* (2013.01); *H01L 2224/024* (2013.01);
(Continued)
(58) Field of Classification Search
CPC . H01L 24/02; H01L 24/13; H01L 2224/0239; H01L 2224/02381;
(Continued)

(56) References Cited

U.S. PATENT DOCUMENTS 9,520,352 B2 12/2016 Arisaka et al.
9,591,750 B2 3/2017 Tanaka et al.
(Continued)

FOREIGN PATENT DOCUMENTS

JP WO2008/120755 A1 10/2008
JP 2015-079795 A 7/2012
(Continued)

OTHER PUBLICATIONS

Communication dated Nov. 9, 2019, issued by the Korean Patent Office in counterpart Korean Application No. 10-2018-0102886.
(Continued)

*Primary Examiner* — Fernando L Toledo
*Assistant Examiner* — Adam S Bowen
(74) *Attorney, Agent, or Firm* — Sughrue Mion, PLLC

(57) ABSTRACT

A semiconductor package includes a connection member having first and second surfaces opposing each other and including at least one insulating layer and redistribution layer, the redistribution layer including a via penetrating through the insulating layer and a RDL pattern connected to the via while being located on an upper surface of the insulating layer; a semiconductor chip disposed on the first surface and including a connection pad connected to the redistribution layer; and an encapsulant disposed on the first surface and encapsulating the semiconductor chip. The redistribution layer includes a seed layer disposed on a surface of the insulating layer and a plating layer disposed on the seed layer. An interface between the insulating layer and a portion of the seed layer constituting the via includes a first uneven surface with a surface roughness of 30 nm or more.

17 Claims, 19 Drawing Sheets

(52) U.S. Cl.
CPC .......... *H01L 2224/0231* (2013.01); *H01L 2224/0235* (2013.01); *H01L 2224/0239* (2013.01); *H01L 2224/02331* (2013.01); *H01L 2224/02379* (2013.01); *H01L 2224/02381* (2013.01); *H01L 2224/13024* (2013.01); *H01L 2924/35121* (2013.01)

(58) Field of Classification Search
CPC ....... H01L 2224/024; H01L 2224/0235; H01L 2224/0231; H01L 2224/02331; H01L 2224/02379; H01L 2924/35121; H01L 2224/13024
USPC .......................................................... 257/739
See application file for complete search history.

(56) References Cited

U.S. PATENT DOCUMENTS

| | | |
|---|---|---|
| 2006/0056162 A1 | 3/2006 | Koide |
| 2010/0103634 A1 | 4/2010 | Funaya et al. |
| 2012/0153463 A1 | 6/2012 | Maeda |
| 2015/0102510 A1 | 4/2015 | Kaneda et al. |
| 2016/0322332 A1* | 11/2016 | Kim .................. H01L 23/16 |
| 2017/0055345 A1* | 2/2017 | Kim .................. H05K 1/0271 |
| 2017/0133309 A1 | 5/2017 | Kim et al. |
| 2017/0256482 A1 | 9/2017 | Furuichi et al. |
| 2017/0365566 A1 | 12/2017 | Lee et al. |
| 2018/0337117 A1* | 11/2018 | Nishihara ........... H01L 22/10 |

FOREIGN PATENT DOCUMENTS

| | | |
|---|---|---|
| JP | 2012-142559 A | 4/2015 |
| KR | 10-2006-0023935 A | 3/2006 |
| KR | 10-2017-0142811 A | 12/2017 |

OTHER PUBLICATIONS

Communication dated Feb. 3, 2020, issued by the Taiwan Patent Office in counterpart Taiwan Application No. 108105353.
Office Action dated May 18, 2020 by the Taiwanese Intellectual Property Office in counterpart Taiwanese Patent Application No. 108105353.

* cited by examiner

SEMICONDUCTOR PACKAGE

CROSS-REFERENCE TO RELATED APPLICATION(S)

This application claims the benefit of priority to Korean Patent Application No. 10-2018-0102886 filed on Aug. 30, 2018 with the Korean Intellectual Property Office, the disclosure of which is incorporated herein by reference in its entirety.

TECHNICAL FIELD

The present disclosure relates to a semiconductor package.

BACKGROUND

A packaging technique for achieving device lightness, slimness and compactness has been actively researched. In this regard, it is very important to ensure reliability of a package against thermal stress in a manufacturing process or a use environment.

Such thermal stress may occur intensively at contact points between dissimilar materials. As a consequence, a redistribution layer in an insulating layer may be defective, thereby causing a problem of lowering package reliability.

SUMMARY

An aspect of the present disclosure is to provide a semiconductor package in which degradations in reliability due to thermal stress occurring between dissimilar materials may be reduced.

According to an aspect of the present disclosure, a semiconductor package includes a connection member having a first surface and a second surface opposing each other, and including at least one insulating layer and at least one redistribution layer, the at least one redistribution layer including a via penetrating through the at least one insulating layer and a RDL pattern connected to the via while being located on an upper surface of the at least one insulating layer; a semiconductor chip disposed on the first surface of the connection member and including a connection pad connected to the at least one redistribution layer; and an encapsulant disposed on the first surface of the connection member and encapsulating the semiconductor chip. The at least one redistribution layer includes a seed layer disposed on a surface of the at least one insulating layer and a plating layer disposed on the seed layer, and an interface between the at least one insulating layer and a portion of the seed layer constituting the via includes a first uneven surface with a surface roughness of 30 nm or more.

According to an aspect of the present disclosure, a semiconductor package includes a connection member having a first surface and a second surface opposing each other, and including an insulating layer and a redistribution layer, the redistribution layer including a via penetrating through the insulating layer; a semiconductor chip disposed on the first surface of the connection member and including a connection pad connected to the redistribution layer; and an encapsulant disposed on the first surface of the connection member and encapsulating the semiconductor chip. The insulating layer includes an opening through which the via penetrates, and the redistribution layer includes a seed layer disposed on a side wall of the opening and on an upper surface of the insulating layer, and a plating layer disposed on the seed layer. The side wall of the opening and the upper surface of the insulating layer have a surface roughness greater than a surface roughness of a portion of the seed layer located on a bottom surface of the via.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
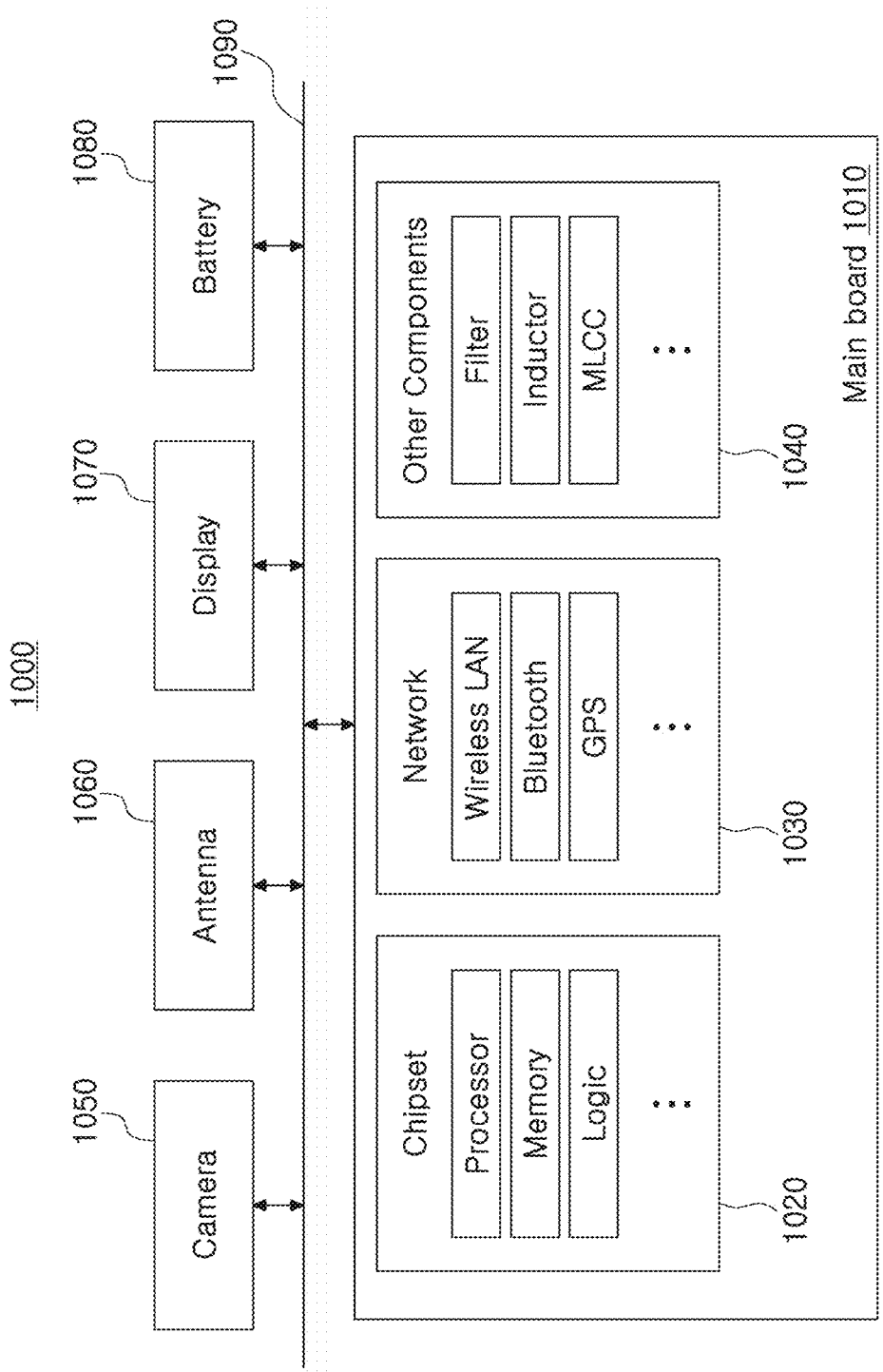
FIG. 1 is a schematic block diagram illustrating an example of an electronic device system.

Hereinafter, exemplary embodiments of the present disclosure will be described with reference to the accompanying drawings. The shape and size of constituent elements in the drawings may be exaggerated or reduced for clarity.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. The terms "first," "second," etc. may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected to each other. These components may be connected to other components, to be described below, to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include components implementing protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
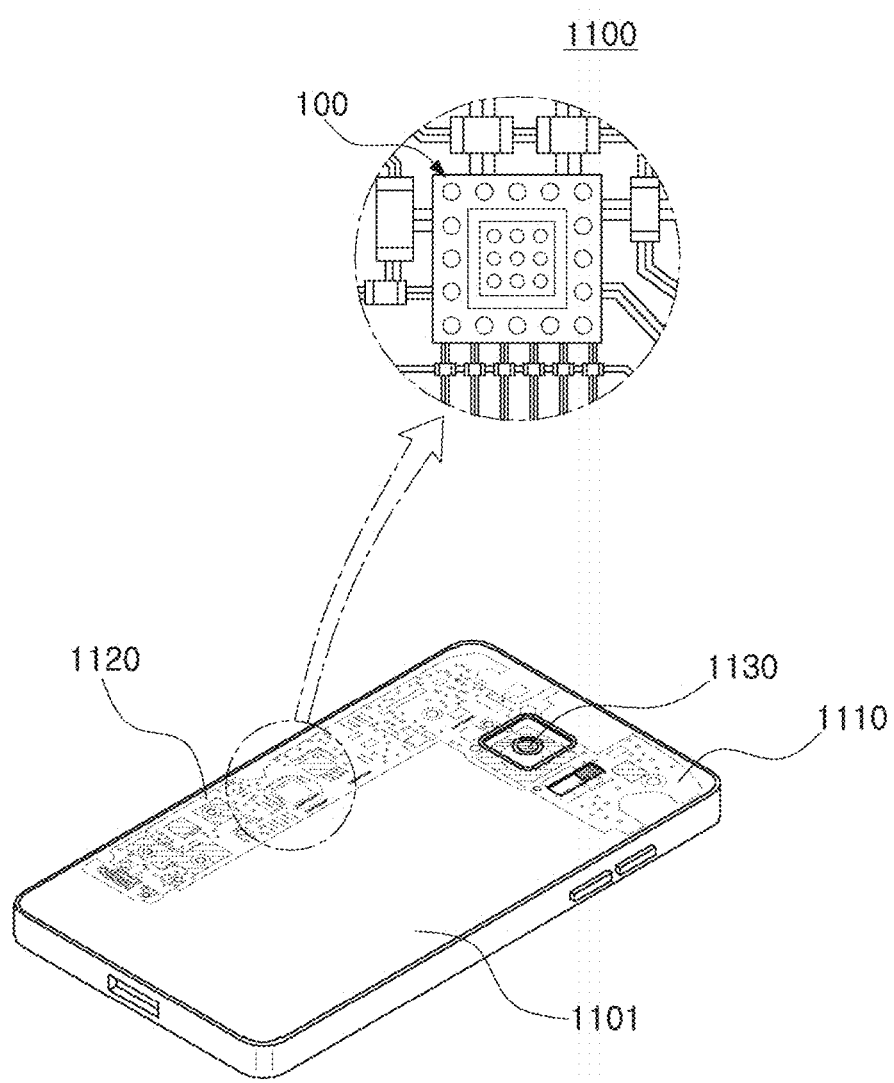
FIG. 2 is a schematic perspective view of an example of an electronic device.

FIG. 2 is a schematic perspective view illustrating an example of an electronic device.

Referring to FIG. 2, a semiconductor package may be used for various purposes in the various electronic devices 1000 as described above. For example, a mainboard 1110 may be accommodated in a body 1101 of a smartphone 1100, and various electronic components 1120 may be physically or electrically connected to the mainboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in itself, and may be damaged due to external physical or chemical impact. Therefore, the semiconductor chip may not be used by itself, but is instead packaged and used in an electronic device or the like in a package state.

The reason why semiconductor packaging is commonly used is that there is generally a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and use of packaging technology for buffering a difference in a circuit width between the semiconductor and the mainboard is thus advantageous.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3:
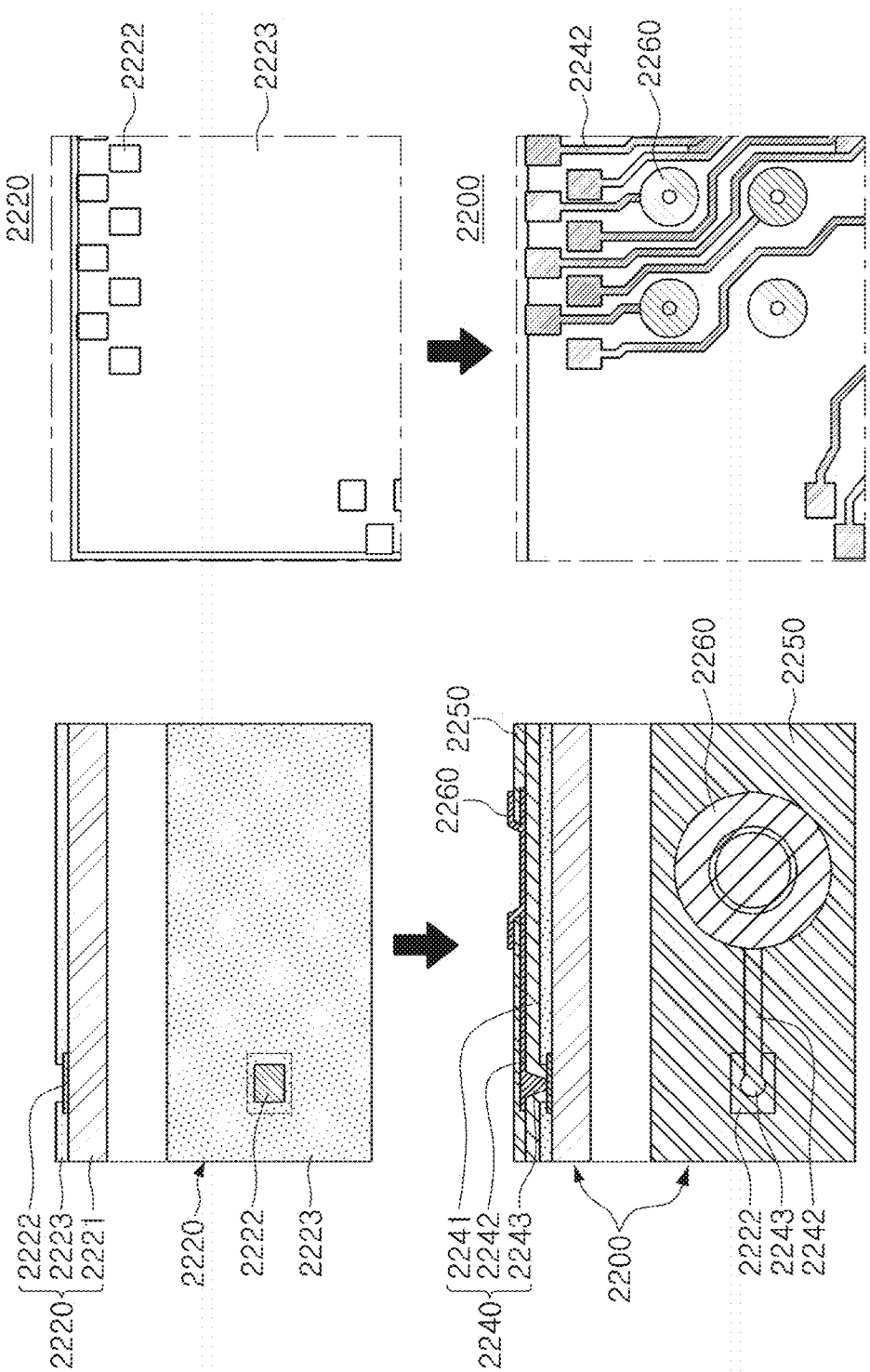
FIGS. 3A and 3B are cross-sectional views schematically illustrating a fan-in semiconductor package before and after packaging.
Figure 4:
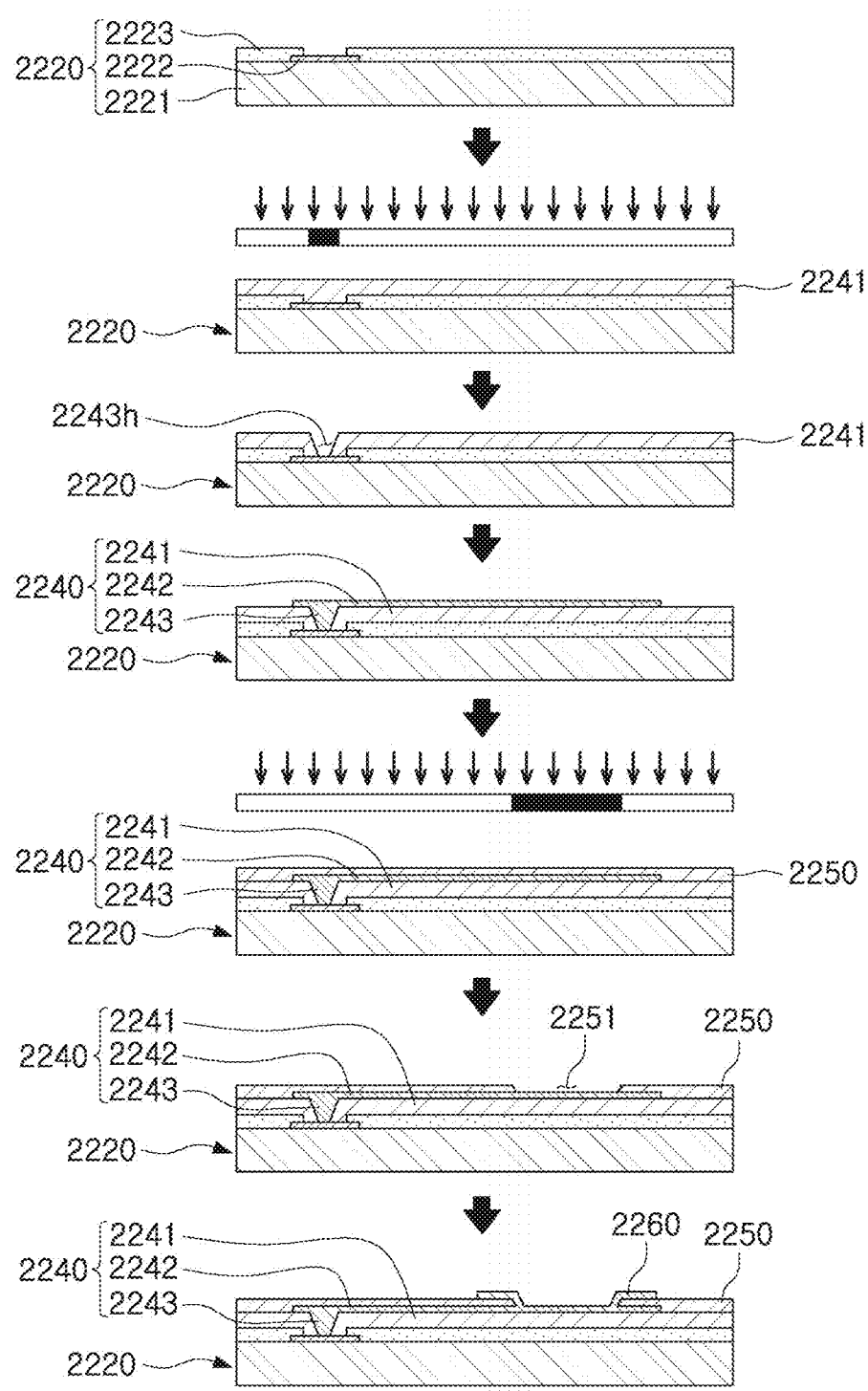
FIG. 4 is a schematic cross-sectional view of a packaging process of a fan-in semiconductor package.

FIGS. 3A and 3B are schematic cross-sectional views illustrating a fan-in semiconductor package before and after being packaged, and FIG. 4 shows a series of schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the mainboard of the electronic device, or the like.

Therefore, depending on a size of the semiconductor chip 2220, a connection member 2240 may be formed on the semiconductor chip 2220 to redistribute the connection pads 2222. The connection member 2240 may be formed by forming an insulating layer 2241 on the semiconductor chip 2220 using an insulating material such as a photoimageable dielectric (PID) resin, forming via holes 2243h opening on to the connection pads 2222, and then forming wiring patterns 2242 and vias 2243. Then, a passivation layer 2250 protecting the connection member 2240 may be formed, and an opening 2251 may be formed to have an underbump metal layer 2260, or the like, extending therethrough. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals generally need to be disposed inside the semiconductor chip in the fan-in semiconductor package, the fan-in semiconductor package has a large spatial limitation. Therefore, it may be difficult to apply this structure to a semiconductor chip having a large number of I/O terminals or a semiconductor chip having a small size. In addition, due to the disadvantages described above, the fan-in semiconductor package may not be directly mounted and used on the mainboard of the electronic device. The reason is that even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
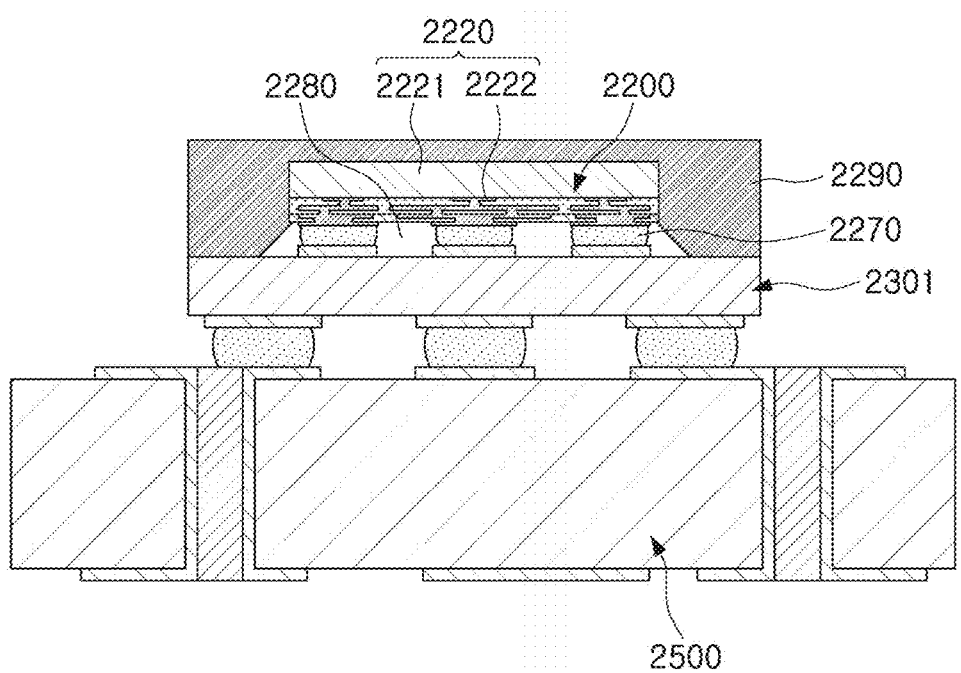
FIG. 5 is a cross-sectional view schematically illustrating a case in which a fan-in semiconductor package is mounted on an interposer substrate to ultimately be mounted on a mainboard of an electronic device.
Figure 6:
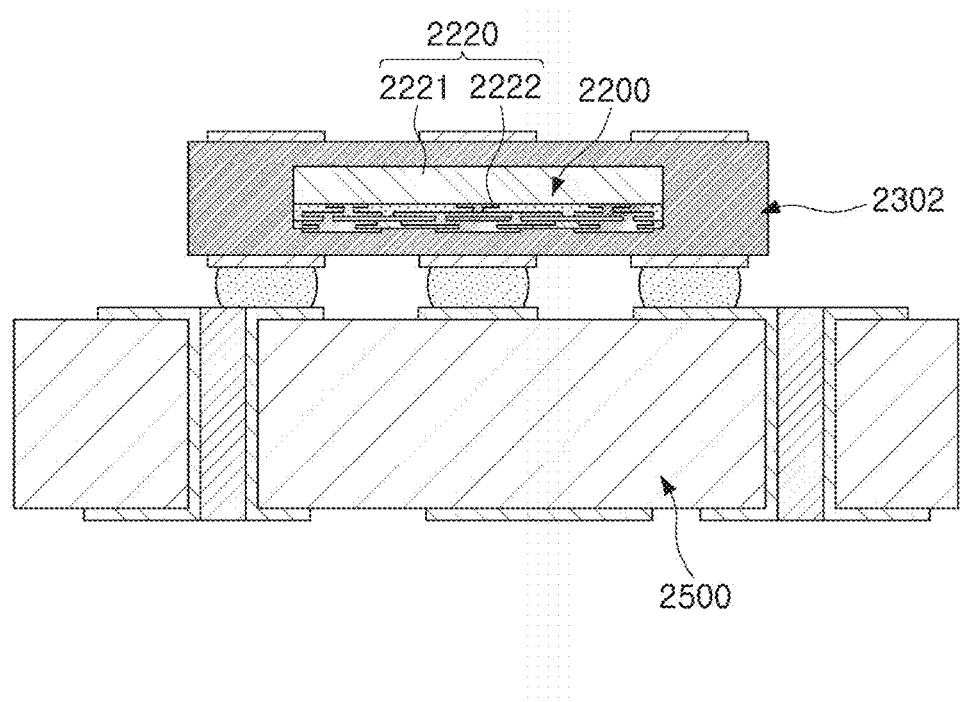
FIG. 6 is a cross-sectional view schematically illustrating a case in which a fan-in semiconductor package is embedded in an interposer substrate to ultimately be mounted on a mainboard of an electronic device.

FIG. 5 is a schematic cross-sectional view illustrating a fan-in semiconductor package mounted on an interposer substrate that is ultimately mounted on a mainboard of an electronic device, and FIG. 6 is a schematic cross-sectional view illustrating a fan-in semiconductor package embedded in an interposer substrate that is ultimately mounted on a mainboard of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an external surface of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard (e.g., 2500) of the electronic device. Therefore, the fan-in semiconductor package may be mounted on the separate interposer substrate (e.g., 2301 or 2302) and be then mounted on the mainboard of the electronic device through a packaging process or may be mounted and used on the mainboard of the electronic device in a state in which it is embedded in the interposer substrate.

Fan-Out Semiconductor Package

Figure 7:
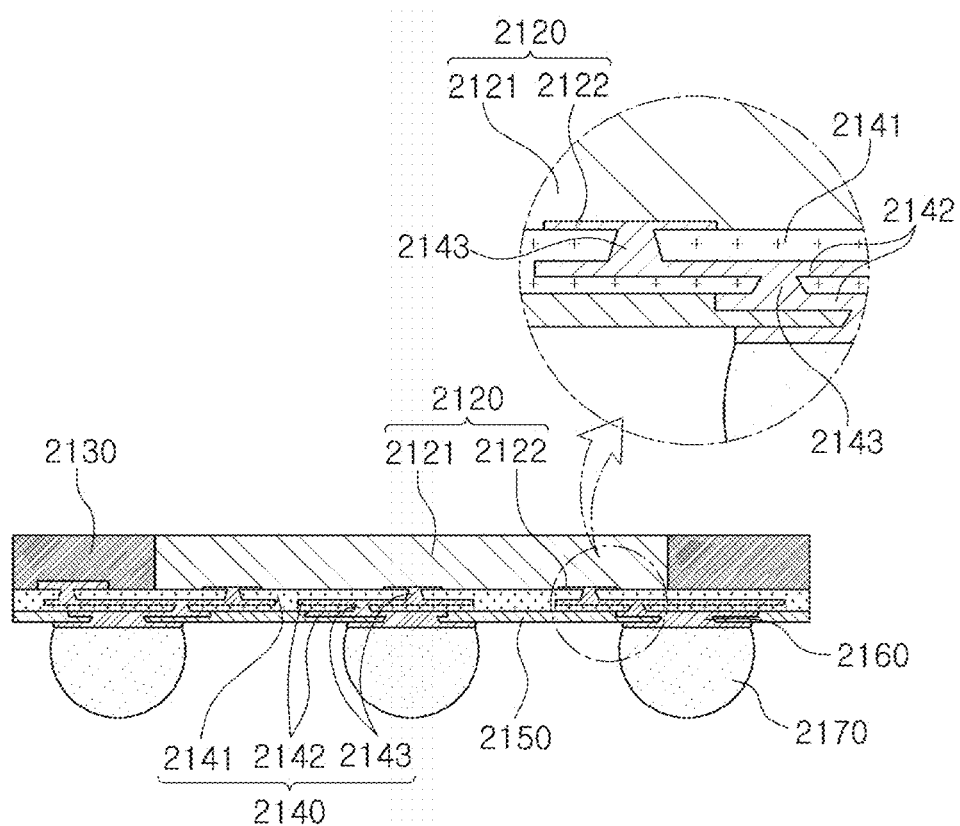
FIG. 7 is a schematic cross-sectional view of a fan-out semiconductor package.

FIG. 7 is a schematic cross-sectional view illustrating a fan-out semiconductor package.

Referring to FIG. 7, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection member 2140 may be formed after the encapsulant 2130 is formed outside the semiconductor chip 2120. In this case, a process for forming the connection member 2140 is performed to form the via(s) connecting the redistribution layers and the connection pads 2122 of the semiconductor chip 2120 to each other and the redistribution layers 2142, and the vias 2143 may thus have a width reduced toward the semiconductor chip 2120 (see an enlarged region).

As described above, the fan-out semiconductor package may have a form in which I/O terminals of the semiconductor chip are redistributed and disposed outwardly of the semiconductor chip 2120 through the connection member 2140 formed on the semiconductor chip 2120. As described above, in the fan-in semiconductor package, all I/O terminals of the semiconductor chip generally need to be disposed inside the semiconductor chip (e.g., within the footprint of the semiconductor chip on the package). Therefore, when a size of the semiconductor chip is decreased, a size and a pitch of balls generally need to be decreased, such that a standardized ball layout may not be used in the fan-in semiconductor package. On the other hand, the fan-out semiconductor package has the form in which the I/O terminals of the semiconductor chip 2120 are redistributed and disposed outwardly of the semiconductor chip 2120 (e.g., outwardly from the footprint of the semiconductor chip) through the connection member 2140 formed on the semiconductor chip as described above.

Figure 8:
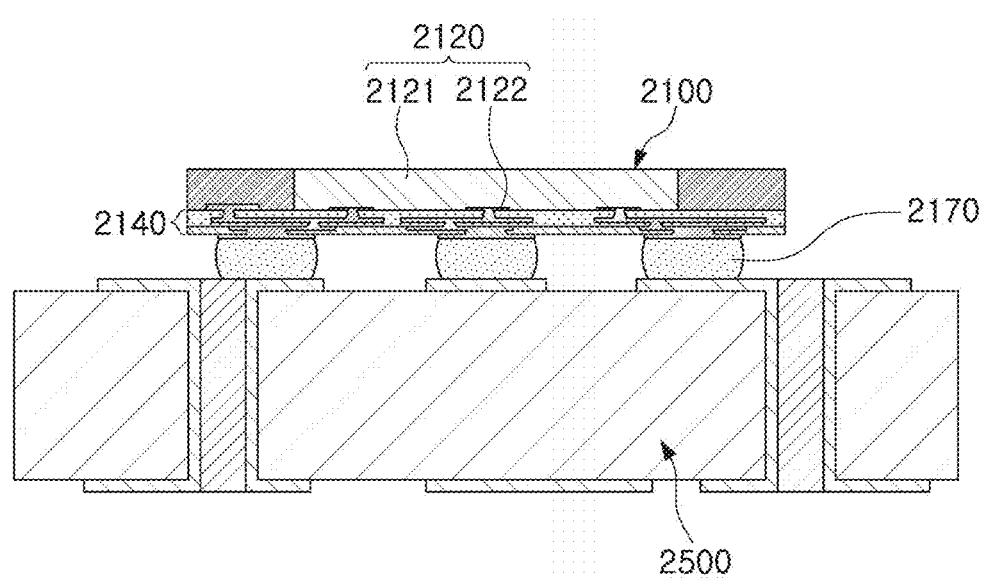
FIG. 8 is a schematic cross-sectional view of a case for a fan-out semiconductor package mounted on a mainboard of an electronic device.

FIG. 8 is a schematic cross-sectional view of a case for a fan-out semiconductor package mounted on a mainboard of an electronic device;

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of an area/footprint of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem caused by the occurrence of a warpage phenomenon.

Meanwhile, the fan-out semiconductor package refers to a packaging technology for mounting the semiconductor chip on the mainboard of the electronic device, or the like, as described above, and protecting the semiconductor chip from external impacts. The fan-out semiconductor package is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
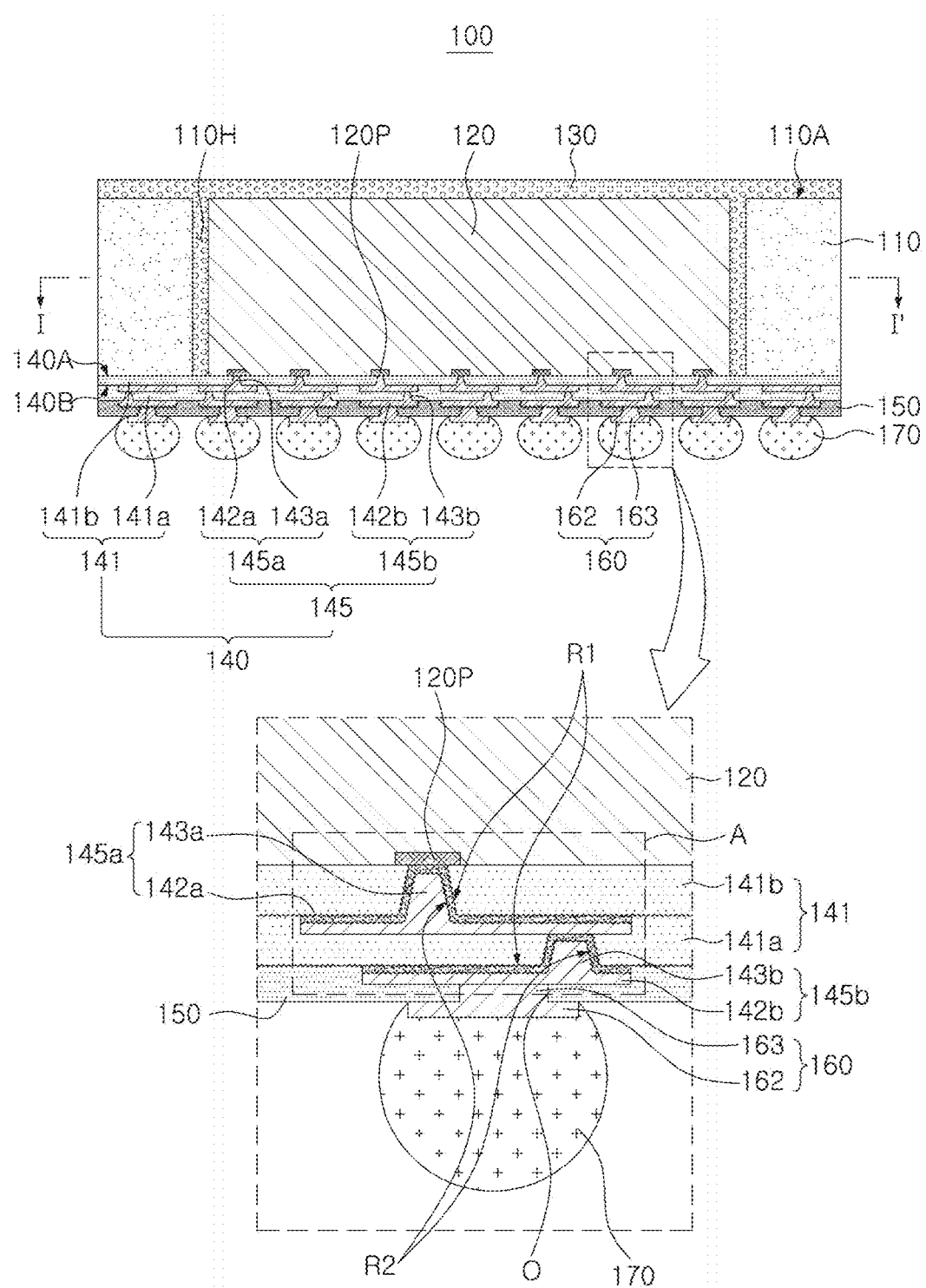
FIG. 9 is a schematic cross-sectional view of a semiconductor package according to an exemplary embodiment in the present disclosure.
Figure 10:
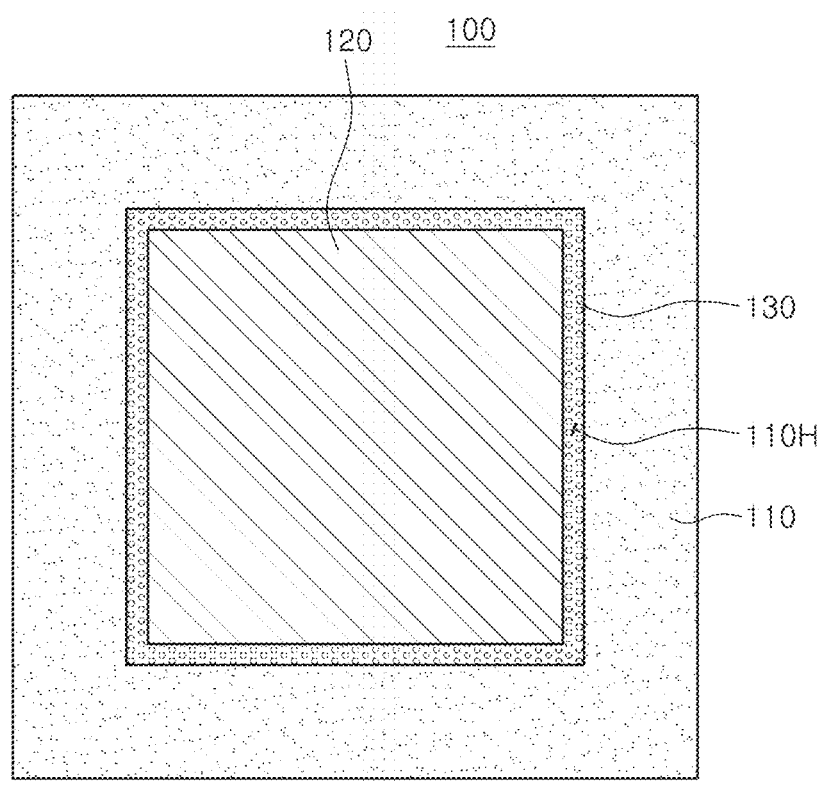
FIG. 10 is a plan view of the semiconductor package, taken along line I-I' in FIG. 9.

FIG. 9 is a schematic cross-sectional view of a semiconductor package according to an exemplary embodiment, and FIG. 10 is a plan view of the semiconductor package, taken along line I-I' in FIG. 9.

Referring to FIGS. 9 and 10, a semiconductor package 100 according to an exemplary embodiment may include a connection member 140 having a first surface 140A and a second surface 140B opposing each other and including a redistribution layer (RDL) 145, a semiconductor chip 120 disposed on the first surface 140A of the connection member 140 and including a connection pad 120P connected to the redistribution layer 145, and an encapsulant 130 disposed on the first surface 140A of the connection member 140 and encapsulating the semiconductor chip 120.

The connection member 140 may include an insulating member 141 and the redistribution layer 145 formed on the insulating member 141. The redistribution layer 145 may include first and second redistribution layers 145*a* and 145*b* disposed on two different levels, for example, on first and second insulating layers 141*a* and 141*b* of the insulating member 141, respectively. Although the redistribution layer 145 employed in the exemplary embodiment is illustrated as having a dual-layer structure by way of example, the redistribution layer 145 may also have a single layer structure or a structure with different number of layers.

In the exemplary embodiment, the redistribution layer 145 may be structurally composed of the RDL pattern 142 and the via 143. In detail, the first redistribution layer 145*a* includes a first RDL pattern 142*a* disposed on the first insulating layer 141*a*, and a first via 143*a* penetrating through the first insulating layer 141*a* to connect the first RDL pattern 142*a* and the connection pad of the semiconductor chip 120 to each other. Similarly, the second redistribution layer 145*b* includes a second RDL pattern 142*b* disposed on the second insulating layer 141*b*, and a second via 143*b* penetrating through the second insulating layer 141*b* to connect the first and second RDL patterns 142*a* and 142*b* to each other.

In another aspect, the redistribution layer 145 may be comprised of a seed layer 145S (referring to FIG. 11) disposed on respective surfaces of the first and second insulating layers 141*a* and 141*b*, and a plating layer 145P disposed on the seed layer 145S. For example, the seed layer 145S may include at least one of titanium (Ti), nickel (Ni), chromium (Cr), and tungsten (W). In a specific example, the seed layer 145S may include Ti—Cu or Ti—W. For example, the plating layer 145P may include copper (Cu).

In the case of the connection member 140 employed in the exemplary embodiment, the insulating member 141 and the redistribution layer 145 are formed of dissimilar materials of a resin and a metal, and thus, relatively large thermal stress may occur due to a difference in thermal expansion coefficient between the dissimilar materials, causing the occurrence of defects such as delamination or cracks between dissimilar materials.

In some examples, the insulating member 141, for example, the first and second insulating layers 141a and 141b, may be formed of a photoimageable dielectric (PID) material, and fine first and second vias 143a and 143b having, for example, a diameter of about 30 μm or less, may be formed in the first and second insulating layers 141a and 141b, using a photolithography process. In this case, bonding strength of the first and second vias 143a and 143b may be greatly reduced due to a reduction in a contact area thereof with the first and second insulating layers 141a and 141b, and in a case in which a considerable thermal stress occurs, delamination, defects such as being lifting-off, or the like may be easily caused. As a result, the reliability of a semiconductor package may be greatly reduced.

Figure 11:
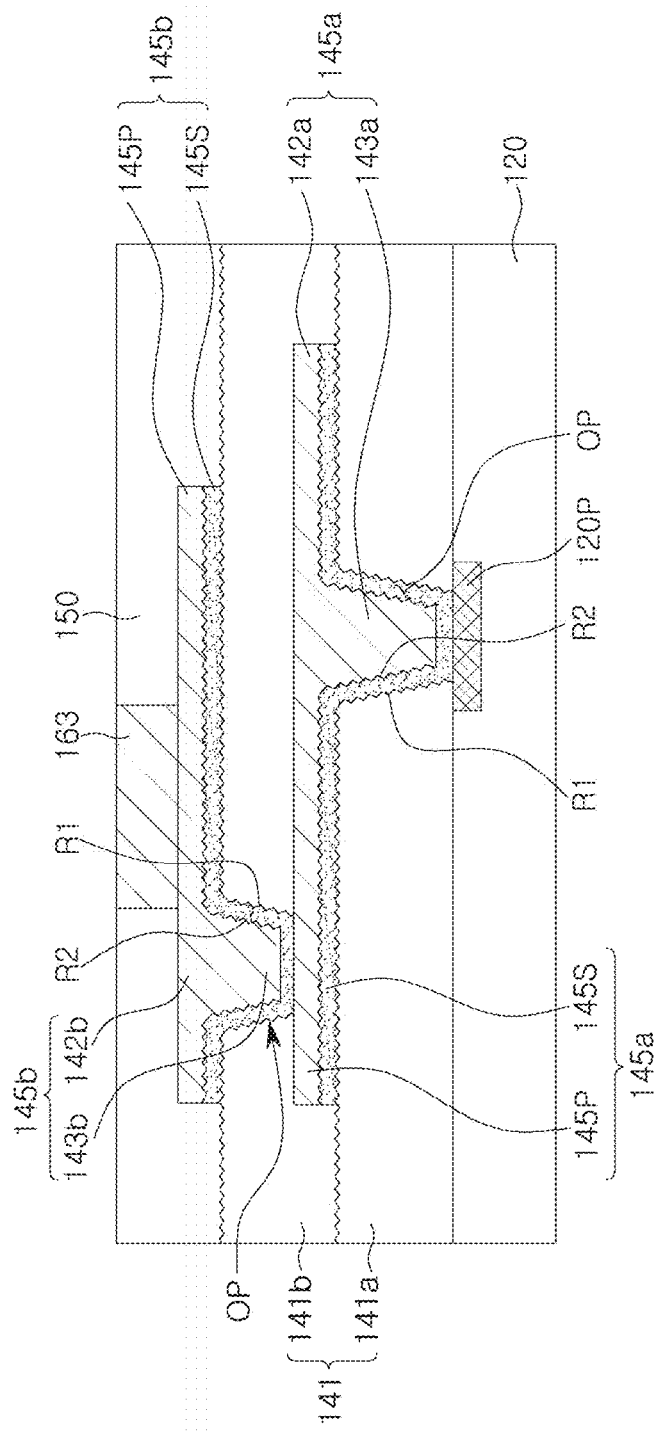
FIG. 11 is an enlarged cross-sectional view illustrating portion A of the semiconductor package of FIG. 9.

FIG. 11 is an enlarged cross-sectional view illustrating portion A of the semiconductor package of FIG. 9.

Referring to FIG. 11 together with FIG. 9, an interface between the first insulating layer 141a and a portion of the seed layer 145S constituting the first via 143a, and an interface between the second insulating layer 141b and a portion of the seed layer 145S constituting the second via 143b, may have a first uneven surface R1. Such a first uneven surface may improve bonding strength between the via and the insulating layer.

Interfaces between the seed layer 145S and the plating layer 145P also respectively have a second uneven surface R2. This second uneven surface R2 may be obtained by forming the first uneven surface R1 to have a sufficient surface roughness. For example, to provide the second uneven surface R2 to another surface of the seed layer 145S, the first uneven surface R1 may be formed to have a surface roughness Rz of about 30 nm or more. For example, the surface roughness of the first uneven surface R1 may be about 50 nm or more. In a specific example, the surface roughness of the first uneven surface R1 may range from about 50 to about 70 nm.

As referred to herein, the term "about" in the context of dimensions or other units encompasses variation in the corresponding quantity caused by measurement tolerances and/or manufacturing tolerances. For example, roughness when measured using an ellipsometer may have different tolerance than when measured using an atomic force microscope. Thus, depending on the quantity being referred, the range encompassed by "about" would be different and understood by those of skill in the art.

The first uneven surface R1 may be provided by providing sufficient roughness to side walls of openings OP of the first and second insulating layers 141a and 141b, which will be described later with reference to processes illustrated in FIGS. 14A to 14E.

The first uneven surface R1 may have a surface roughness at least greater than a surface roughness of portions of the seed layers 145S located on bottom surfaces of the first and second vias 143a and 143b. As described above, the first uneven surface R1 may be obtained by intentionally providing sufficient roughness to the surfaces of the first and second insulating layers 141a and 141b, while portions of the seed layers 145S located on bottom surfaces of the first and second vias 143a and 143b are located on a conductive pattern, for example, on the connection pad 120P or the first redistribution layer 145a, to which an additional roughening treatment is not applied, and thus, may not have an intentionally-provided surface roughness. Thus, the side walls of the first and second vias 143a and 143b, for example, the first uneven surfaces R1, may have a surface roughness greater than a surface roughness of the bottom surfaces of the first and second vias 143a and 143b.

In this exemplary embodiment, although the first and second uneven surfaces R1 and R2 are illustrated as being applied to both the first and second vias 143a and 143b, some vias may only be provided with an uneven surface selectively. For example, the first and second uneven surfaces R1 and R2 may only be provided to portions of the seed layer 145S of the first via 143a of the first redistribution layer 145a adjacent to the semiconductor chip 120 generating heat.

In this exemplary embodiment, the first uneven surface R1 may respectively extend to an interface between an upper surface of the first insulating layer 141a and a portion of the seed layer 145S constituting the first RDL pattern 142a, and an interface between an upper surface of the second insulating layer 141b and a portion of the seed layer 145S constituting the second RDL pattern 142b. As illustrated in FIG. 11, upper surfaces of the first and second insulating layers 141a and 141b may be formed to have a surface roughness similar to that of the first uneven surface R1, which may be understood as a result that the upper surfaces of the first and second insulating layers 141a and 141b are also exposed and coarsened together with an inner side wall of the opening OP in a process of roughening the inner side wall of the opening OP. The second uneven surface R2 may also extend to interfaces between portions of the seed layers 145S, constituting the first and second RDL patterns 142a and 142b, and the plating layers 145P.

The semiconductor package 100 includes a passivation layer 150 disposed on the second surface 140B of the connection member 140, and an under bump metallurgy (UBM) layer 160 connected to the second RDL pattern 142b or the second redistribution layer 145b through a plurality of openings of the passivation layer 150.

The UBM layer 160 employed in this exemplary embodiment may include a plurality of UBM pads 162 disposed on the passivation layer 150, and a plurality of UBM vias 163 penetrating through the passivation layer 150 to respectively connect the plurality of UBM pads 162 and the second RDL pattern 142b. The second RDL pattern 142b may have a shape and a size corresponding to those of a respective relevant UBM pad 162.

The semiconductor package 100 may include a plurality of electrical connection structures 170 disposed on the plurality of UBM layers 160, in detail, on the plurality of UBM pads 162, respectively. The semiconductor package 100 may be mounted on a pad of a substrate such as a mainboard, using the electrical connection structures 170. In this case, the UBM layer 160 may suppress cracking of the electrical connection structure 170 occurring due to thermal shock between the electrical connection structure 170 and the redistribution layer 145, thereby improving package reliability.

Hereinafter, respective components of the semiconductor package 100 according to the exemplary embodiment will be described in more detail.

A support frame 110 may improve rigidity of the semiconductor package 100, and may secure the uniformity of thickness of the encapsulant 130 or the like. A sidewall of the semiconductor chip 120 in the cavity 110H may be spaced apart from a sidewall of the support frame 110 by a predetermined distance. A side portion of the semiconductor chip 120 may be surrounded by the support frame 110. In some embodiments, the support frame 110 may be omitted.

The support frame 110 may include an insulating material. For example, the insulating material may include a thermosetting resin such as an epoxy resin or a thermoplastic resin such as polyimide, and may be provided as a resin in which these resins are mixed with an inorganic filler or are impregnated with a core material such as a glass fabric or the like, together with an inorganic filler. In a specific example, as the support frame, a prepreg resin, Ajinomoto Build-up Film (ABF), FR-4 resin, bismaleimide triazine (BT) resin, or the like may be used. For example, when the support frame 110 having a relatively high degree of rigidity, such as a prepreg resin including a glass fabric or the like, is used, warpage of the semiconductor package 100 may be controlled.

The semiconductor chip 120 may be an integrated circuit (IC) in which hundreds to millions of devices are integrated into a single chip. The integrated circuit may be a processor chip, such as a central processor, for example, a CPU, a graphics processor, for example, a GPU, a field programmable gate array (FPGA), a digital signal processor, a cryptographic processor, a microprocessor, a microcontroller, and the like, in detail, may be an application processor (AP), but is not limited thereto. For example, the integrated circuit may be a logic chip such as an analog-to-digital converter, an application-specific IC (ASIC), and the like, or may be a memory chip such as a volatile memory, for example, a DRAM, a nonvolatile memory, for example, a ROM, a flash memory, and the like. Further, these circuits may also be disposed to be combined with each other.

The semiconductor chip 120 may be formed, based on an active wafer. In this case, as a base material forming a body, silicon (Si), germanium (Ge), gallium arsenic (GaAs), or the like may be used. Various types of circuits may be formed in the body. The connection pad 120P may be provided to electrically connect the semiconductor chip 120 to other components. As a material of the connection pad 120P, a conductive material such as aluminum (Al) may be used without any particular limitations. A passivation film (not illustrated) may be formed on the body, to expose the connection pad 120P. The passivation film may be an oxide film, a nitride film or the like, or may be a double layer of an oxide film and a nitride film. A lower surface of the connection pad 120P may have a step with a lower surface of the encapsulant 130 through the passivation film, and the encapsulant 130 may be prevented from bleeding to the lower surface of the connection pad 120P. An insulating film (not illustrated) or the like may further be disposed in a required position. Although the semiconductor chip 120 may be a bare die, a redistribution layer (not illustrated) may further be formed on an active surface of the semiconductor chip 120, on which the connection pad 120P has been formed, as required, and the semiconductor chip 120 may also have a form in which a bump (not illustrated) or the like is connected to the connection pad 120P.

The encapsulant 130 may be configured to have a structure to protect electronic components such as the semiconductor chip 120, the support frame 110 and the like. The form of encapsulating is not particularly limited, and may be any form as long as it surrounds at least portions of the support frame 110, the semiconductor chip 120 and the like. For example, the encapsulant 130 may cover an upper surface of the support frame 110 and the semiconductor chip 120, and may fill a space between a sidewall of the cavity 110H and a side surface of the semiconductor chip 120. In addition, the encapsulant 130 may fill at least a portion of a space between the semiconductor chip 120 and the connection member 140. By filling the cavity 110H with the encapsulant 130, the encapsulant 130 may serve as an adhesive according to a detailed material, and furthermore, may serve to reduce buckling.

For example, as the encapsulant 130, a thermosetting resin such as an epoxy resin or a thermoplastic resin such as polyimide may be used. Alternatively, a resin in which these resins are mixed with an inorganic filler or are impregnated with a core material such as glass fabric or the like together with an inorganic filler, may be used. For example, a prepreg resin, ABF resin, FR-4 resin, BT resin or the like may be used. In some exemplary embodiments, a photoimageable dielectric (PID) resin may be used.

The connection member 140 may include an insulating member 141 and the redistribution layer 145 formed on the insulating member 141, as described above. The insulating member 141 may include a thermosetting resin such as an epoxy resin or a thermoplastic resin such as polyimide. For example, a prepreg resin, ABF resin, FR-4 resin, BT resin or the like may be used. In a specific example, the insulating member 141 may be formed using a photoimageable dielectric material such as a PID resin. For example, in the case of using a photoimageable dielectric material, the respective insulating layers 141a and 141b may be formed to have a relatively reduced thickness, and may more easily obtain a fine pitch of the via 143. For example, in the case of the respective insulating layers 141a and 141b, a thickness between patterns except for the RDL pattern 142 may range from about 1 μm to about 10 μm.

In the exemplary embodiment, the insulating member 141 may include a photoimageable dielectric material such as a PID resin, and the passivation layer 150 may include a thermosetting resin or a thermoplastic resin, as a non-photoimageable dielectric material.

The RDL pattern 142 may perform various functions according to the design of relevant layers. For example, the RDL pattern 142 may include a ground (GND) pattern, a power (PoWeR: PWR) pattern, and a signal (Signal: S) pattern. In this case, the signal S pattern may include various signals except for a ground (GND) pattern, a power (PWR) pattern and the like, for example, include a data signal or the like. In addition, a via pad pattern, a solder pad pattern, and the like may be included. For example, the RDL pattern 142 may include a conductive material such as copper (Cu), aluminum (Al), silver (Ag), tin (Sn), gold (Au), nickel (Ni), lead (Pb), titanium (Ti), or combinations thereof. For example, a thickness of the RDL pattern 142 may range from about 0.5 μm to about 15 μm.

The via 143 may be used as an element located on another level. For example, the via 143 may include a conductive material, such as copper (Cu), aluminum (Al), silver (Ag), tin (Sn), gold (Au), nickel (Ni), lead (Pb), titanium (Ti), alloys thereof, or the like. The via 143 may be entirely filled with a conductive material, or may be obtained as a conductive material is formed along a wall of a via. For example, the via 143 may have various shapes, such as a tapered shape or a cylindrical shape.

The electrical connection structure 170 may be formed of a conductive material, for example, a low melting-point alloy such as Sn—Al—Cu, but a material thereof is not limited thereto. The electrical connection structure 170 may be a land, a ball, a pin, or the like. The electrical connection structure 170 may be formed of multiple layers or a single layer. For example, when the electrical connection structure 170 is formed of multiple layers, the electrical connection structure 170 may include a copper pillar and a low-melting point alloy. The number, spacing, arrangement type, and the like of the electrical connection structures 170 are not particularly limited, and may be sufficiently modified according to the design specifications in the art.

Figure 12:
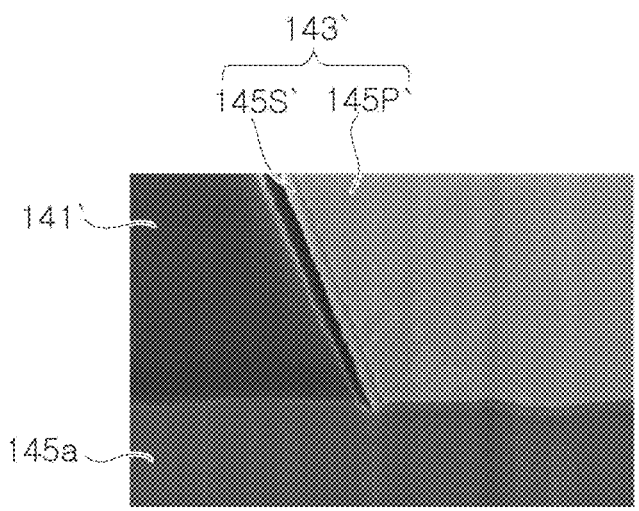
FIGS. 12 and 13 are enlarged images provided by capturing portions of semiconductor packages, according to a comparative example to which unevenness is not applied and an exemplary embodiment of the present disclosure to which unevenness is applied, respectively.
Figure 13:
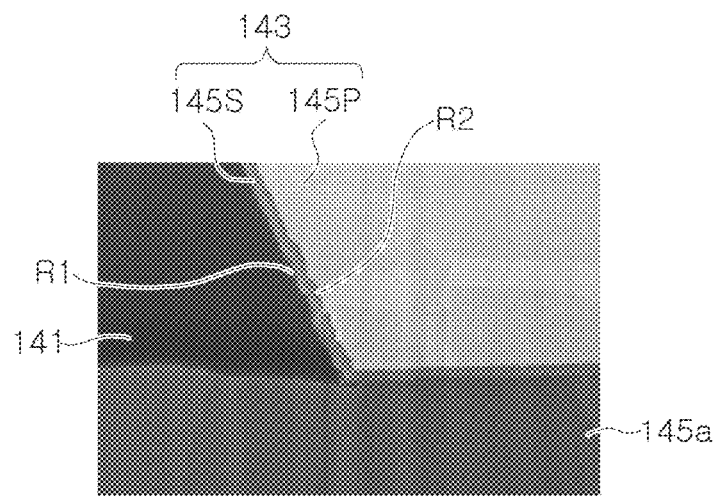

FIGS. 12 and 13 are enlarged images provided by capturing portions of semiconductor packages, according to a comparative example to which unevenness is not applied and according to an exemplary embodiment of the present disclosure to which unevenness is applied, respectively.

Referring to FIG. 12, in the case of a seed layer 145S' constituting a via 143', unevenness is not formed on an interface thereof with a plating layer 145P', as well as on an interface thereof with an insulating layer 141'. It can be seen that both interfaces are relatively smooth. Since such a smooth interface has a relatively small contact area, adhesion strength is low. In detail, in the case of a miniaturized via, defects such as being easily lifted from the insulating layer 141' may be caused.

In a manner differently therefrom, referring to FIG. 13, a first uneven surface R1 is formed at an interface between the second insulating layer 141b and the seed layer 145S constituting the via 143, and a second uneven surface R2 is also formed at an interface between the seed layer 145S constituting the via 143 and the plating layer 145P. By the first and second uneven surfaces R1 and R2, adhesion strength between the via 143 and the insulating layer 141 may be strengthened, thereby improving reliability of the semiconductor package.

A surface roughness Rz of the first uneven surface R1 may be about 30 nm or more, in detail, about 50 nm or more. On the other hand, a bottom surface of the via 143 in contact with the first redistribution layer 145a may have a surface roughness less than a surface roughness of the first uneven surface R1. In detail, since unevenness is not intentionally formed on an exposed region of the first redistribution layer 145a, the first redistribution layer has a substantially smooth surface with, for example, a surface roughness of about 10 nm or less, while the side wall of the via 143 may have a relatively high surface roughness identical to that of the first uneven surface.

Hereinafter, a method of manufacturing a semiconductor package according to an exemplary embodiment in the present disclosure will be described with reference to the accompanying drawings. Various features and advantages will be understood in detail in describing the method below.

FIGS. 14A to 14E are cross-sectional views illustrating major processes of a method of manufacturing a semiconductor package according to an exemplary embodiment, and illustrate parts shown in FIG. 11, as portion A of the semiconductor package 100.

The method of manufacturing a semiconductor package according to the exemplary embodiment illustrates a process of forming a connection member in the method of manufacturing the semiconductor package 100 illustrated in FIG. 9. In detail, a series of processes illustrate a process of forming a second redistribution layer after a first insulating layer and a first redistribution layer 145a of a connection member 140 are formed on an active surface of a semiconductor chip 120.

Figure 14A:
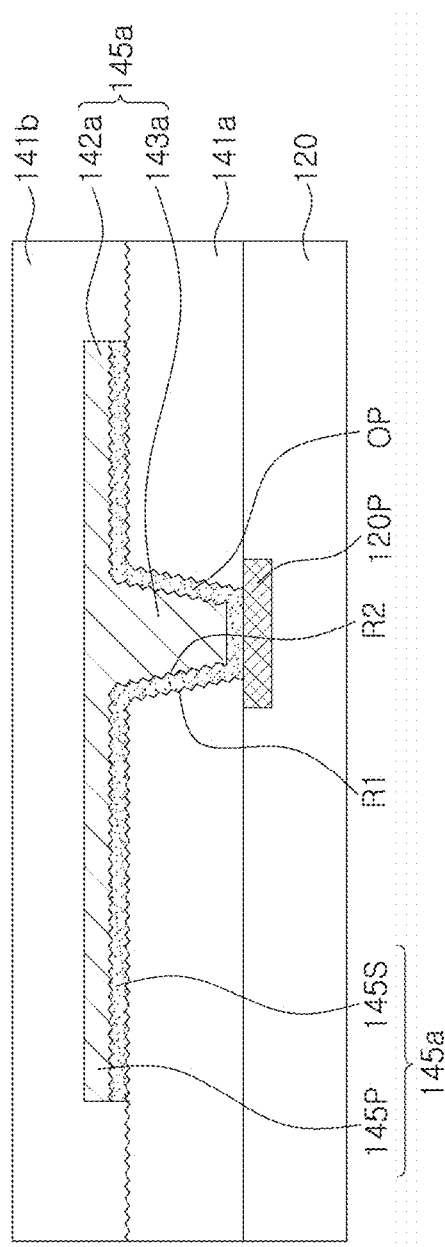
FIGS. 14A to 14E are cross-sectional views illustrating main processes of a method of manufacturing a semiconductor package according to an exemplary embodiment in the present disclosure.

Referring to FIG. 14A, a second insulating layer 141b may be formed on a first insulating layer 141a on which a first redistribution layer 145a is formed.

The second insulating layer 141b may be formed of a material similar to that of the first insulating layer 141a. In this exemplary embodiment, the second insulating layer 141b may include a photoimageable dielectric material. This process may be performed by a lamination process using an uncured film, but is not limited thereto. A method of applying and curing a liquid photoimageable dielectric material may be used.

In another embodiment, the second insulating layer 141b may include a thermosetting resin such as an epoxy resin or a thermoplastic resin such as polyimide. For example, a prepreg resin, ABF resin, FR-4 resin, BT resin or the like may be used.

Figure 14B:
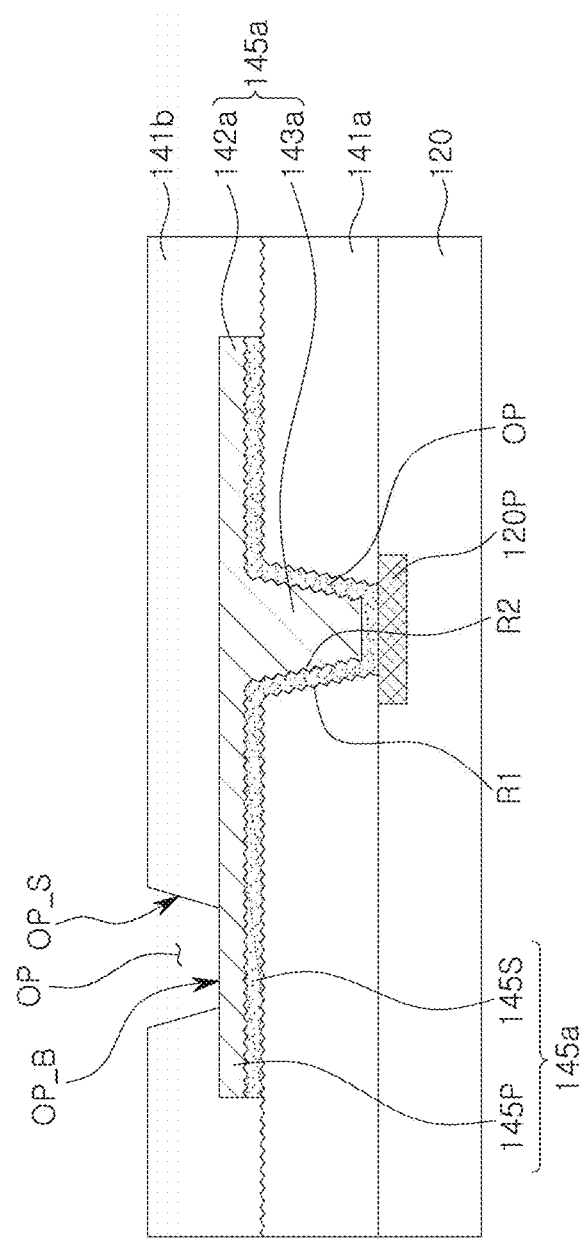

Next, referring to FIG. 14B, an opening OP to form a via in the second insulating layer 141b may be formed.

The formation process of the opening OP may be performed using a photolithography process. Since a precise photolithography process is used, the size of the opening OP may be significantly reduced to provide a fine pitch of, for example, about 30 µm or less. The opening OP may include a side wall OP_S provided by the second insulating layer 141b and a bottom surface OP_B provided as the first RDL pattern 142a.

In another embodiment, when a thermosetting resin or a thermoplastic resin is used for the second insulating layer 141b, the opening OP may be formed using a laser drilling process. For example, an excimer laser, a UV laser, or a $CO_2$ laser may be used.

Figure 14C:
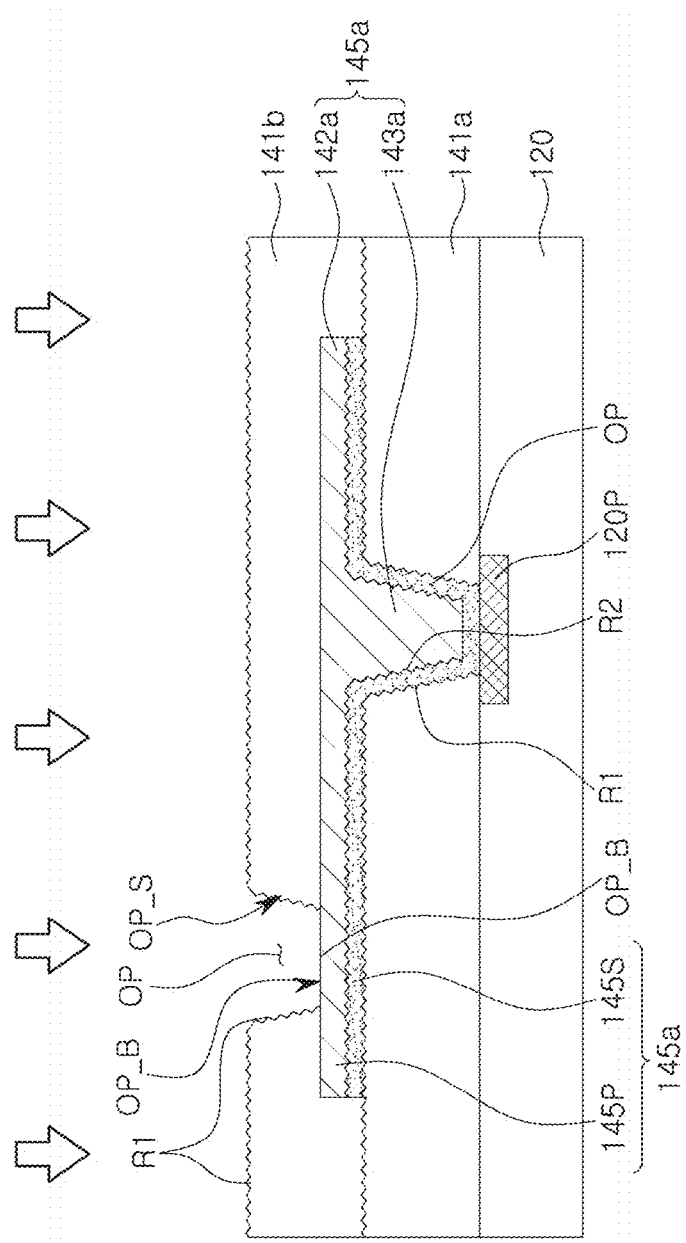

Next, referring to FIG. 14C, a roughening treatment may be applied to the second insulating layer 141b in which the opening OP is formed.

This roughening treatment may be performed by a plasma pretreatment process using oxygen ($O_2$) and an inert gas, for example, argon (Ar). In this case, the first uneven surface R1 may be formed on an upper surface of the second insulating layer 141b as well as on the side wall OP_S of the opening OP. On the other hand, since a first wiring pattern exposed to the opening does not react to the roughening treatment, the bottom surface OP_B of the opening OP may not be provided with intentional surface roughness.

In another embodiment, an etchant for a chemical reaction may be used in place of the roughening process using plasma as described above. For example, a separate desmearing process may be performed on the side wall OP_S of the opening OP. In this case, an uneven surface is not provided on the upper surface of the second insulating layer 141b and on the bottom surface OP_B of the opening OP, and an uneven surface may only be provided on the side wall OP_S of the opening OP (See FIG. 15).

Figure 14D:
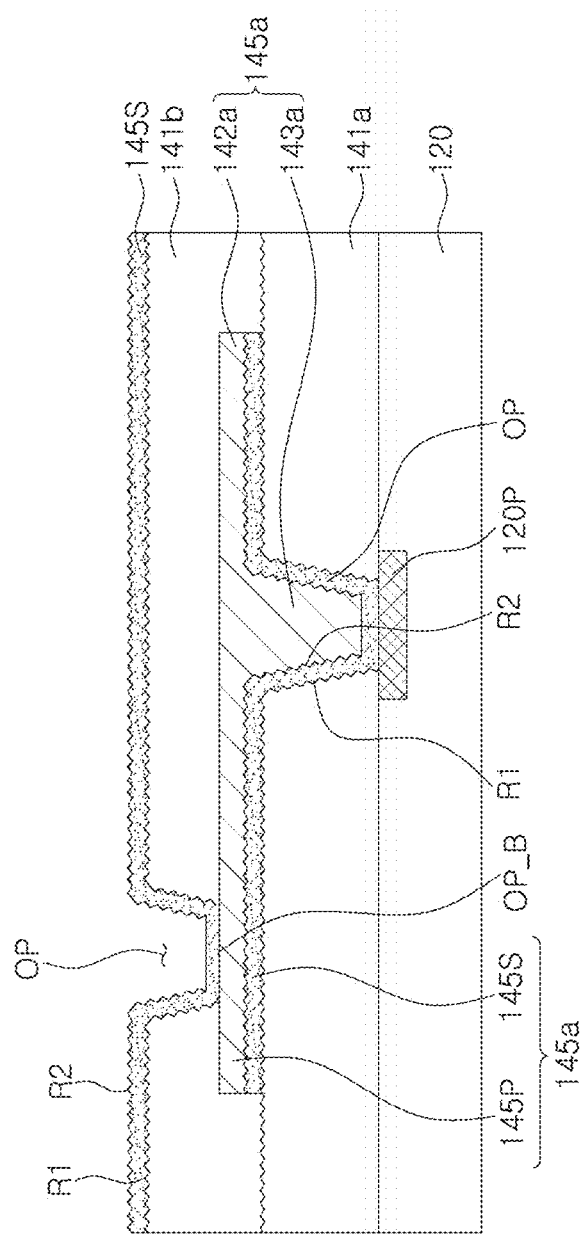

Referring to FIG. 14D, the seed layer 145S may be formed on the second insulating layer 141b having been subjected to the roughening treatment.

The seed layer 145S may be formed on an exposed surface of the second insulating layer 141b, on the side wall OP_S of the opening OP and the bottom surface OP_B of the opening OP, and on the upper surface of the second insulating layer 141b. For example, this deposition process may be performed by chemical vapor deposition (CVD), physical vapor deposition (PVD), or sputtering. For example, the seed layer 145S may include at least one of titanium (Ti), nickel (Ni), chromium (Cr), and tungsten (W). In a specific example, the seed layer 145S may be a Ti—Cu layer or a Ti—W layer.

Figure 14E:
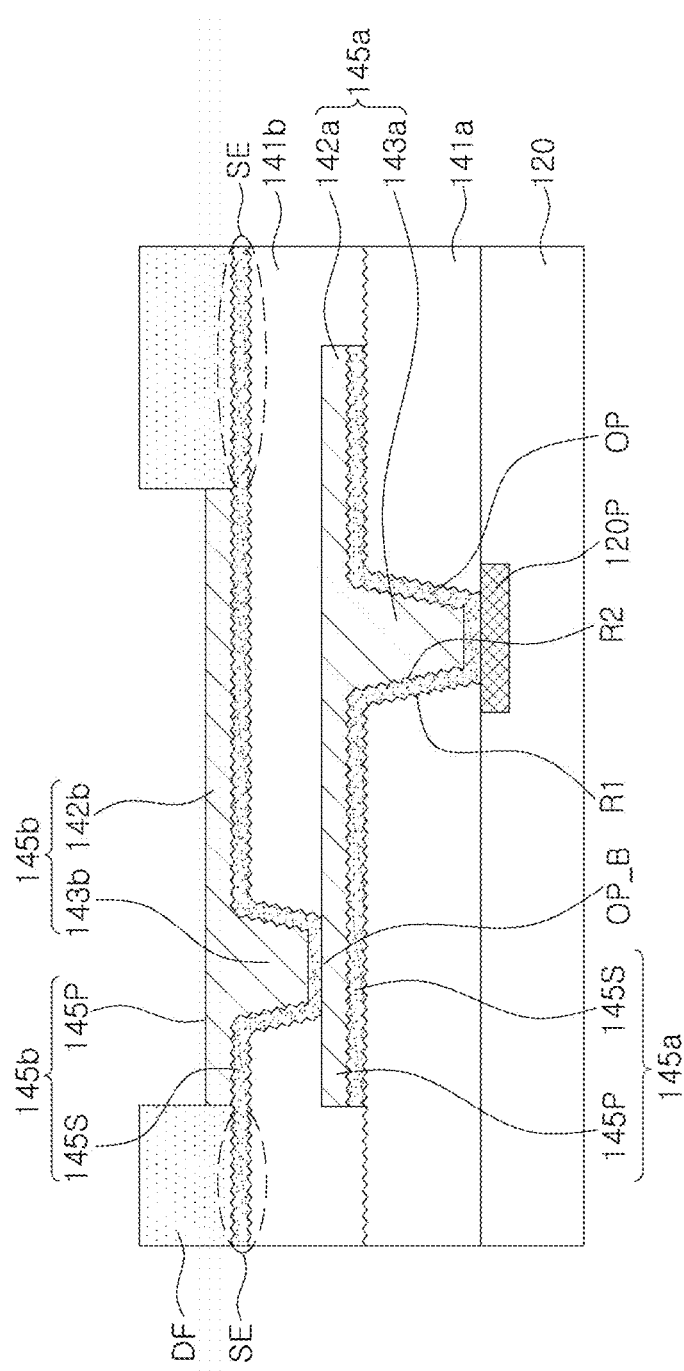

Next, referring to FIG. 14E, a plating layer 145P may be formed on a required region of the seed layer 145S.

This process may be performed by electrolytic copper plating, electroless copper plating or the like, using a dry film pattern (DF). In detail, electrolytic copper plating or electroless copper plating may be performed after forming a dry film on an entire region of the seed layer 145S and forming a dry film pattern DF in such a manner that a required region of the seed layer 145S is exposed. For example, a plating process may be performed using a method such as a subtractive process, an additive process, a semi-additive process (SAP), a modified semi-additive process (MSAP), or the like, but is not limited thereto.

In a subsequent process, after removing the dry film pattern DF, an exposed region SE of the seed layer 145S may be selectively removed using an etchant to form a required second redistribution layer 145b. In addition, the semiconductor package 100 illustrated in FIGS. 9 and 11 may be manufactured by forming the passivation layer 150 and forming the UBM layer 160 and the electrical connection structure 170 connected to the second redistribution layer 145b.

The roughening treatment (see FIG. 14B) may be performed by a plasma pretreatment process using oxygen ($O_2$) and an inert gas, for example, Ar, as in the foregoing embodiment. To obtain a required surface roughness, a plasma treatment process using an inert gas may be performed together with an oxygen plasma treatment. Table 1 below shows the surface roughness obtained depending on plasma pretreatment conditions on a surface of a photoimageable material layer such as PID.

As illustrated in Table 1 below, a plasma treatment process using an inert gas such as Ar may be performed after the oxygen ($O_2$) plasma treatment is performed, rather than only performing the oxygen ($O_2$) plasma treatment, thereby obtaining a surface roughness of about 30 nm or more.

TABLE 1

| Plasma Pretreatment Conditions | Surface Roughness (Rz: nm) |
|---|---|
| No Treatment | 3.233 |
| $O_2$ (2 minutes) | 8.807 |
| $O_2$ (2 minutes) + Ar (1 minute) | 59.621 |
| $O_2$ (2 minutes) + Ar (2 minutes) | 39.613 |
| $O_2$ (2 minutes) + Ar (3 minutes) | 49.252 |

The exemplary embodiments of the present disclosure may be applied to various types of semiconductor packages. For example, a redistribution structure may be introduced into the support frame 110, and in this case, the semiconductor package may be utilized as a package-on-package (POP)-type fan-out package.

Figure 15:
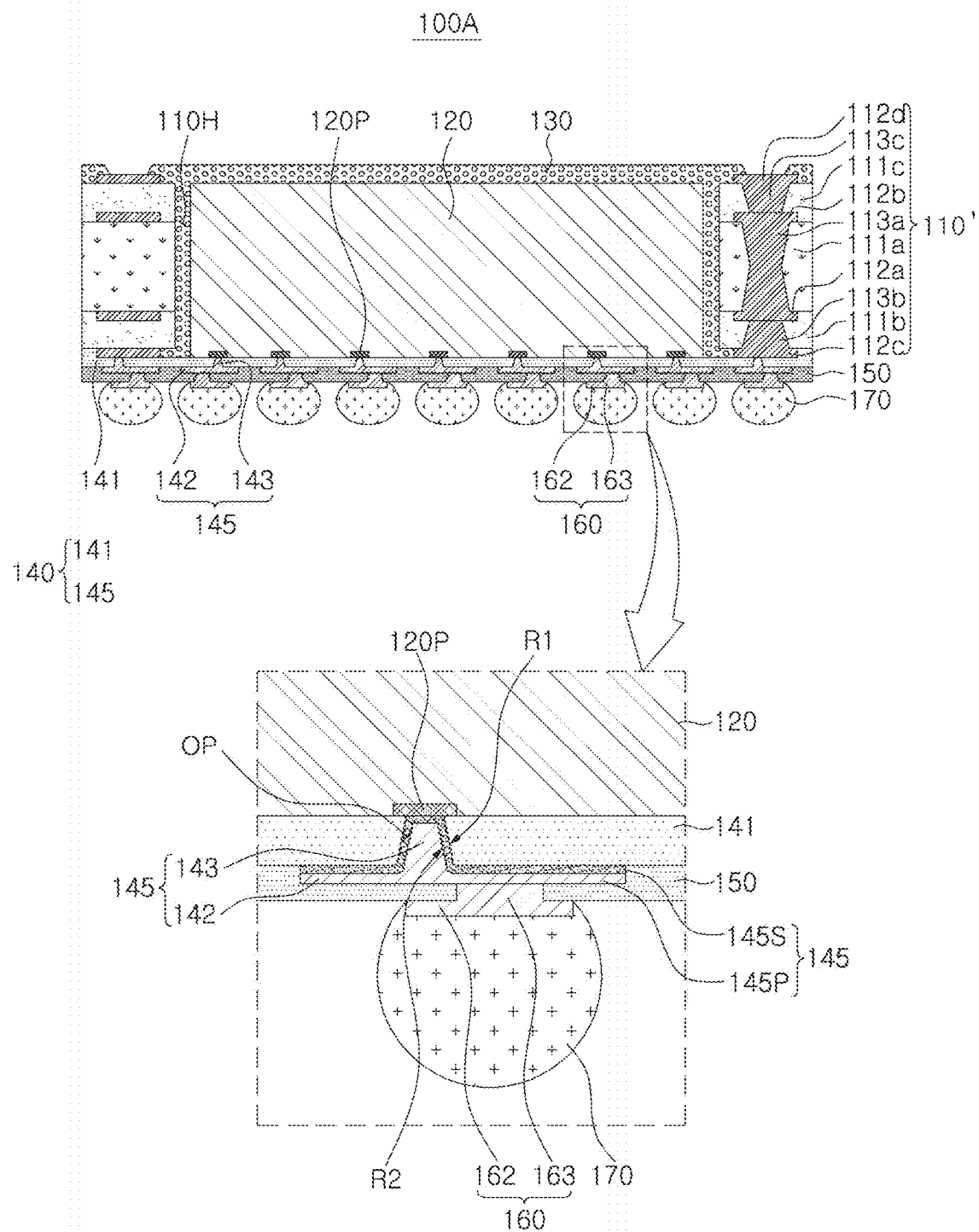
FIGS. 15 and 16 are cross-sectional side views illustrating a semiconductor package according to various embodiments of the present disclosure.

FIG. 15 is a side cross-sectional view illustrating a semiconductor package according to an exemplary embodiment of the present disclosure.

Referring to FIG. 15, a semiconductor package 100A according to an exemplary embodiment may have a structure similar to the structure illustrated in FIG. 9, except that a support frame 110' has a wiring structure and a redistribution layer 145 of a connection member 140 is different from that illustrated in FIG. 9. The description of components of this embodiment may be referred to the description of the same or similar components of the semiconductor package 100 illustrated in FIG. 9, unless specifically explained otherwise.

The semiconductor package 100A according to this embodiment may include the support frame 110' having a cavity 110H in which a semiconductor chip 120 is to be mounted. The support frame 110' may be disposed on a connection member 140 and may have a wiring structure connected to a redistribution layer 145.

In detail, the support frame 110' employed in this exemplary embodiment may include a first dielectric layer 111a, a first distribution layer 112a and a second distribution layer 112b disposed on two surfaces of the first dielectric layer 111a, a second dielectric layer 111b disposed on the first insulating layer 112a and covering the first distribution layer 112a, a third distribution layer 112c disposed on the second dielectric layer 111b, a third dielectric layer 111c disposed on the first dielectric layer 111a to cover the second distribution layer 112b, and a fourth distribution layer 112d disposed on the third dielectric layer 111c. The first to fourth distribution layers 112a, 112b, 112c and 112d may be electrically connected to the connection pad 120P of the semiconductor chip 120.

Since the support frame 110 may include a relatively larger number of first to fourth distribution layers 112a, 112b, 112c and 112d, the connection member 140 may be further simplified. Thus, a reduction in yield due to defects occurring in the process of forming the connection member 140 may be reduced.

The first to fourth distribution layers 112a, 112b, 112c and 112d may be electrically connected to each other through first to third vias 113a, 113b and 113c penetrating through the first through third dielectric layers 111a, 111b and 111c, respectively.

The first dielectric layer 111a may have a thickness greater than a thickness of each of the second dielectric layer 111b and the third dielectric layer 111c. The first dielectric layer 111a may be relatively thick to basically maintain rigidity, and the second dielectric layer 111b and the third dielectric layer 111c may be introduced to form a relatively greater number of distribution layers 112c and 112d. The first dielectric layer 111a may include an insulating material different from that of the second dielectric layer 111b and the third dielectric layer 111c. For example, the first dielectric layer 111a may be formed of, for example, a prepreg resin, including a core material, a filler and an insulating resin, while the second dielectric layer 111b and the third dielectric layer 111c may be an ABF film or a PID film including a filler and an insulating resin, but are not limited thereto. In an aspect similar thereto, the first via 113a penetrating through the first dielectric layer 111a may have a diameter greater than that of each of the second and third vias 113b and 113c penetrating through the second and third dielectric layers 111b and 111c.

A lower surface of the third distribution layer 112c of the support frame 110' may be located to be lower than a lower surface of the connection pad 120P of the semiconductor chip 120. A distance between a RDL pattern 142 of the connection member 140 and the third distribution layer 112c of the support frame 110' may be less than a distance between the RDL pattern 142 of the connection member 140 and the connection pad 120P of the semiconductor chip 120.

As in the exemplary embodiment, the third distribution layer 112c may be disposed on the second dielectric layer 111b to have a form protruding upwardly thereof, and as a result, may thus be in contact with the connection member 140. The first distribution layer 112a and the second distribution layer 112b of the support frame 110' may be located between an active surface and an inactive surface of the semiconductor chip 120. The support frame 110' may be formed to correspond to a thickness of the semiconductor chip 120, and the first distribution layer 112a and the second distribution layer 112b formed in the support frame 110' may be disposed on a level between the active surface and the inactive surface of the semiconductor chip 120.

The thickness of each of the first to fourth distribution layers 112a, 112b, 112c and 112d of the support frame 110' may be greater than a thickness of the RDL pattern 142 of the connection member 140. The support frame 110' may have a thickness identical to or greater than that of the semiconductor chip 120. The first to fourth distribution layers 112a, 112b, 112c and 112d may be formed to have a relatively great thickness. On the other hand, the RDL pattern 142 of the connection member 140 may be formed to have a relatively small thickness to obtain thinning.

The connection member 140 employed in this embodiment includes a single level of redistribution layer 145. The redistribution layer 145 includes a RDL pattern 142 formed on the insulating layer 141, and a via 143 penetrating through the insulating layer 141 to connect the connection pad 120P and the RDL pattern 142. The first uneven surface R1 may only be formed on a side wall of the via 143, and a roughening treatment may not intentionally be applied to between the insulating layer 141 and the RDL pattern 142.

In detail, the first uneven surface R1 may only be formed at an interface between the sidewall of the opening OP and the seed layer 145S, and the second uneven surface R2 may be formed at an interface between a portion of the plating layer 145P and a portion of the seed layer 145S constituting the via 143.

Figure 16:
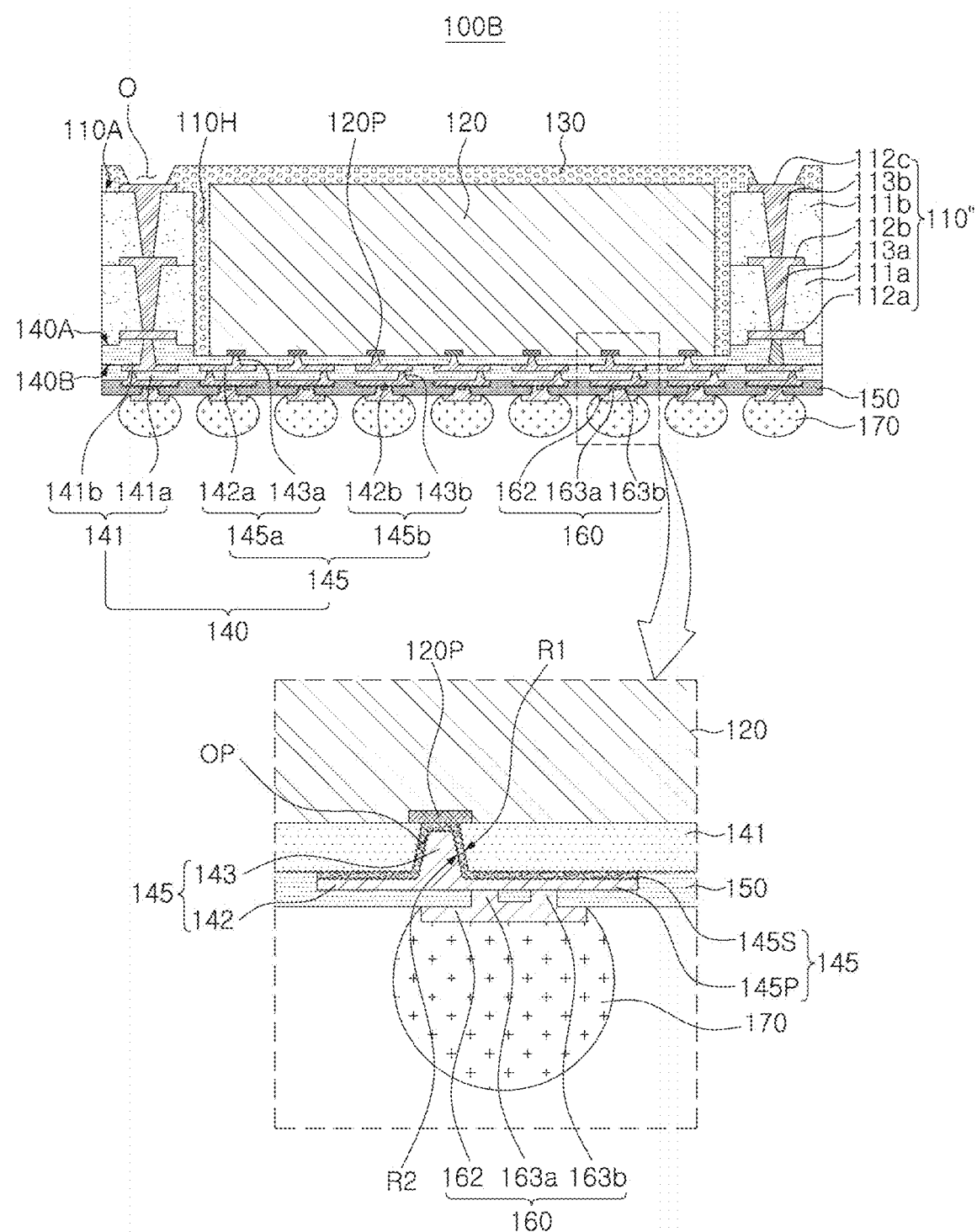

FIG. 16 is a side cross-sectional view illustrating a semiconductor package according to an exemplary embodiment.

Referring to FIG. 16, a semiconductor package 100B according to an exemplary embodiment may be understood as having a structure similar to the structure illustrated in FIG. 9, except for a support member 110" having a wiring structure and a UBM layer 160 having a different structure. The description of components of this exemplary embodiment may be referred to the description of the same or similar components of the semiconductor package 100 illustrated in FIG. 9, unless otherwise specified.

The semiconductor package 100B according to this exemplary embodiment includes the support member 110" having a cavity 110H in which a semiconductor chip 120 is to be mounted. The support member 110" may be disposed on the connection member 140 and may have a wiring structure connected to a redistribution layer 145.

In detail, the support member 110" employed in this exemplary embodiment may include a first dielectric layer 111a having one surface in contact with the connection member 140, a first distribution layer 112a embedded in one surface of the first dielectric layer 111a, a second distribution layer 112b disposed on the other surface of the first dielectric layer 111a, a second dielectric layer 111b disposed on the other surface of the first dielectric layer 111a to cover the second distribution layer 112b, and a third distribution layer 112c disposed on the dielectric layer 111b. The first to third distribution layers 112a, 112b and 112c may be electrically connected to the connection pad 120P of the semiconductor chip 120 by the redistribution layer 145.

The first and second distribution layers 112a and 112b and the second and third distribution layers 112b and 112c may be electrically connected to each other through first and second vias 113a and 113b penetrating through the first and second dielectric layers 111a and 111b, respectively.

For example, when the first distribution layer 112a is embedded in the first dielectric layer 111a, a step generated by a thickness of the first distribution layer 112a may be significantly reduced, and an insulation distance of the connection member 140 may be constant. For example, a difference, between a distance from the first RDL pattern 142a of the connection member 140 to a lower surface of the first dielectric layer 111a and a distance from the first RDL pattern 142a of the connection member 140 to a connection pad 120P of the semiconductor chip 120, may be less than a thickness of the first distribution layer 112a. Thus, a high-density wiring design of the connection member 140 may be facilitated.

The lower surface of the first distribution layer 112a of the support member 110" may be located above a lower surface of the connection pad 120P of the semiconductor chip 120. The first distribution layer 112a may be formed by being recessed into the first dielectric layer 111a. In this case, for example, when the first distribution layer 112a is recessed into the first dielectric layer 111a to form a step between the lower surface of the first dielectric layer 111a and the lower surface of the first distribution layer 112a, a material of an encapsulant 130 may be prevented from bleeding to contaminate the first distribution layer 112a.

A material of the first and second dielectric layers 111a and 111b includes an insulating material, and for example, as the insulating material, a thermosetting resin such as an epoxy resin or a thermoplastic resin such as polyimide may be used. Alternatively, examples of the insulating material may include a resin mixed with an inorganic filler or impregnated with a core material such as glass fiber together with an inorganic filler, for example, a prepreg resin, ABF resin, FR-4 resin, or BT resin. In a specific example, a PID resin may be used.

A UBM layer 160 employed in this exemplary embodiment may include two UBM vias 163a and 163b connecting a UBM pad 162 and a second RDL pattern 142b. In another embodiment, a UBM via 163 of each UBM layer 160 may be provided as a plurality of, for example, three or more vias.

Similarly to the exemplary embodiment of FIGS. 9 and 11, an interface between the first insulating layer 141a and a portion of a seed layer 145S constituting the first via 143a, and an interface between the second insulating layer 141b and a portion of the seed layer 145S constituting the second via 143b, may have a first uneven surface R1. Interfaces between seed layers 145S and plating layers 145P may also respectively have a second uneven surface R2. The first uneven surface R1 may be formed to have a surface roughness Rz of about 30 nm or more to impart the second uneven surface R2 to other surfaces of the seed layer 145S; while portions of the seed layers 145S located on bottom surfaces of the first and second vias 143a and 143b is located on the first redistribution layer 145a or on a conductive pattern, for example, the connection pad 120P, to which an additional roughening treatment is not applied, and thus, may not have an intentionally-provided surface roughness.

As described above, by increasing a contact area between the via of the redistribution layer and the insulating layer to improve bonding strength, defects such as being lifted with respect to a miniaturized via may be effectively prevented.

As set forth above, according to exemplary embodiments, by providing the interface of the insulating layer in contact with the redistribution layer, in detail, a via, as an uneven surface, a contact area between the redistribution layer and the insulating layer may be increased to improve bonding strength, and stress occurring at an interface with the via may be effectively dispersed.

While exemplary embodiments have been shown and described above, it will be apparent to those skilled in the art that modifications and variations could be made without departing from the scope of the present invention as defined by the appended claims.

What is claimed is:

1. A semiconductor package comprising:
a connection member having a first surface and a second surface opposing each other, the connection member including at least one insulating layer formed of a photoimageable dielectric material and at least one redistribution layer, a first surface of the at least one insulating layer corresponding to the first surface of the connection member, the at least one redistribution layer including a via penetrating through the at least one insulating layer and a RDL pattern connected to the via while being disposed on a second surface of the at least one insulating layer opposing the first surface of the at least one insulating layer;

a semiconductor chip disposed on the first surface of the connection member, and including a connection pad connected to the at least one redistribution layer; and an encapsulant disposed on the first surface of the connection member and encapsulating the semiconductor chip, wherein the at least one redistribution layer includes a seed layer disposed on the second surface of the at least one insulating layer, and a plating layer disposed on the seed layer, and the via has a shape in which a width adjacent to the second surface of the connection member is greater than a width adjacent to the first surface of the connection member, and wherein an interface between the at least one insulating layer and the seed layer constituting the via includes a first uneven surface with a surface roughness of 30 nm or more, and the first uneven surface extends to the entire second surface of the at least one insulating layer.

2. The semiconductor package of claim 1, wherein an interface between the seed layer and a portion of the plating layer, comprises a second uneven surface.

3. The semiconductor package of claim 1, wherein the first uneven surface has a surface roughness greater than a surface roughness of a portion of the seed layer on a surface of the via abutting the first surface of the at least one insulating layer.

4. The semiconductor package of claim 1, wherein a surface roughness of the first uneven surface is 50 nm or more.

5. The semiconductor package of claim 1, wherein the seed layer comprises at least one of titanium (Ti), nickel (Ni), chromium (Cr), and tungsten (W), and the plating layer comprises copper (Cu).

6. The semiconductor package of claim 1, wherein the at least one insulating layer comprises a plurality of insulating layers, and the at least one redistribution layer comprises a plurality of redistribution layers disposed on corresponding insulating layers.

7. The semiconductor package of claim 6, wherein each of the portions of the seed layer constituting vias of the plurality of redistribution layers respectively comprises an uneven surface at an interface with the corresponding insulating layers.

8. The semiconductor package of claim 1, further comprising a support frame disposed on the first surface of the connection member, and including a cavity accommodating the semiconductor chip.

9. The semiconductor package of claim 8, wherein the support frame comprises a wiring structure connecting an upper surface and a lower surface of the support frame to each other, wherein the wiring structure is electrically connected to the at least one redistribution layer.

10. The semiconductor package of claim 1, further comprising an electrical connection structure disposed on the second surface of the connection member, and an under bump metal (UBM) layer electrically connecting the electrical connection structure and the at least one redistribution layer to each other.

11. A semiconductor package comprising:
a connection member having a first surface and a second surface opposing each other, the connection member including an insulating layer formed of a photoimageable dielectric material and a redistribution layer, the redistribution layer including a via penetrating through the insulating layer;

a semiconductor chip disposed on the first surface of the connection member and including a connection pad connected to the redistribution layer; and an encapsulant disposed on the first surface of the connection member and encapsulating the semiconductor chip, wherein the insulating layer includes an opening through which the via penetrates, and the redistribution layer includes a seed layer disposed on a side wall of the opening and on a first surface of the insulating layer, and a plating layer disposed on the seed layer, and the via has a shape in which a width adjacent to the second surface of the connection member is greater than a width adjacent to the first surface of the connection member, wherein the side wall of the opening and the first surface of the insulating layer have a surface roughness greater than a surface roughness of a portion of the seed layer located on a surface of the via opposing the first surface of the insulating layer, and wherein an interface between the insulating layer and the seed layer constituting the via includes a first uneven surface that extends to the entire first surface of the insulating layer.

12. The semiconductor package of claim 11, wherein the surface roughness of the side wall of the opening is 30 nm or more.

13. A semiconductor package, comprising:
a semiconductor chip having a connection pad on an active surface, disposed on a connection member such that the active surface directly contacts a first surface of the connection member;

the connection member comprising
an insulating layer formed of a photoimageable dielectric material and comprising a via hole penetrating the insulating layer, a redistribution layer electrically connected to the connection pad and disposed on a first surface of the insulating layer opposite the first surface of the connection member, the redistribution layer including a via disposed in the via hole, wherein the redistribution layer comprises a seed layer disposed on a sidewall of the via hole and the first surface of the insulating layer, and a plating layer disposed on the seed layer, and the via has a shape in which a width adjacent to a second surface of the connection member is greater than a width adjacent to the first surface of the connection member, and wherein an interface between the seed layer and the insulating layer and at an interface between the seed layer and the sidewall of the via hole form a first uneven surface having a surface roughness greater than that at an interface between the seed layer and a layer underlying the via hole on a second surface of the insulating layer opposing the first surface of the insulating layer, and the first uneven surface extends to the entire first surface of the insulating layer.

14. The semiconductor package of claim 13, wherein an interface between the seed layer and a portion of the plating layer, comprises a second uneven surface.

15. The semiconductor package of claim 13, wherein the surface roughness of the first uneven surface is about 30 nm or more.

16. The semiconductor package of claim 13, further comprising an encapsulant disposed on the first surface of the connection member and encapsulating the semiconductor chip.

17. The semiconductor package of claim 13, wherein the seed layer comprises at least one of titanium (Ti), nickel (Ni), chromium (Cr), and tungsten (W), and the plating layer comprises copper (Cu).

* * * * *